(12) United States Patent
Fujino et al.

(10) Patent No.: US 7,679,181 B2
(45) Date of Patent: Mar. 16, 2010

(54) SEMICONDUCTOR DEVICE (75) Inventors: Junji Fujino, Tokyo (JP); Shinichi Takagi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 124 days.

(21) Appl. No.: 11/930,350

(22) Filed: Oct. 31, 2007

(65) Prior Publication Data
US 2009/0020866 A1    Jan. 22, 2009

(30) Foreign Application Priority Data
Jun. 15, 2007   (JP) ............... 2007-158234

(51) Int. Cl.
*H01L 23/12* (2006.01)
(52) U.S. Cl. ................ 257/704; 257/783; 257/E23.193
(58) Field of Classification Search ................. 257/704, 257/783
See application file for complete search history.

(56) References Cited

U.S. PATENT DOCUMENTS

| | | |
|---|---|---|
| 6,787,897 B2 | 9/2004 | Geefay et al. |
| 2002/0179921 A1* | 12/2002 | Cohn .................. 257/99 |
| 2005/0139844 A1* | 6/2005 | Park et al. .......... 257/82 |
| 2005/0185248 A1* | 8/2005 | Tarn .................. 359/291 |

FOREIGN PATENT DOCUMENTS

| | | |
|---|---|---|
| JP | 6-188672 | 7/1994 |
| JP | 8-227946 | 9/1996 |
| JP | 2002-118193 | 4/2002 |
| JP | 2002-208650 | 7/2002 |
| JP | 2003-152131 | 5/2003 |
| JP | 2006-121109 | 5/2006 |

* cited by examiner

*Primary Examiner*—Zandra Smith
*Assistant Examiner*—Mark W Tornow
(74) *Attorney, Agent, or Firm*—Leydig, Voit & Mayer, Ltd.

(57) ABSTRACT

A semiconductor device includes: a package case in which a semiconductor element is mounted, the package case having a bonding portion; a cap having a bonding portion bonded to the bonding portion of the package case so as to hermetically seal the semiconductor element; and one or more bonding/sealing wires disposed between and in contact with the bonding portion of the package case and the bonding portion of the cap such that the one or more bonding/sealing wires form a closed loop and hermetically seal the semiconductor element.

4 Claims, 5 Drawing Sheets

SEMICONDUCTOR DEVICE

BACKGROUND OF THE INVENTION

1. Field of the Invention

The present invention relates to semiconductor devices and manufacturing methods therefor. More particularly, the invention relates to semiconductor devices in which a semiconductor element is hermetically sealed within an enclosure formed by a package case and a cap (or a package lid) that are bonded together using a bonding/sealing wire, and also relates to methods for manufacturing such semiconductor devices.

2. Background Art

A semiconductor element might be physically damaged or its characteristics might be degraded if it is exposed to moisture, contamination, heat, electromagnetic field, etc. To prevent this, semiconductor elements such as high frequency and optical modules need be hermetically sealed and protected from such environmental effects. A common way to hermetically seal a semiconductor element is to mount it in a package case and bond a cap to the package case. At that time, the cap and the package case must be seamlessly bonded together to achieve hermetic sealing.

JPA-08-227946 (1996) also discloses a semiconductor device in which a semiconductor element is hermetically sealed within an enclosure formed by a package case and a cap that are bonded together. To allow the cap to be reliably bonded to the package case, the portion of the cap to be in contact with the package case has a protrusion, and the mating portion of the package case has a groove structure to receive that protrusion. The package case and the cap are bonded together at low temperature by causing the protrusion of the cap to contact and engage the groove structure of the package case and then applying ultrasonic vibration to the cap while pressing the cap and the package case together and holding the package case against movement.

The method for bonding a cap to a package case disclosed in the above-mentioned patent publication requires forming a protrusion on the cap and forming a groove structure on the package case. JP-A-2006-121109 discloses an exemplary method for forming a protrusion on a wafer (or cap). Specifically, after forming a film on the wafer in the wafer manufacturing process, portions of the surface of the wafer are selectively removed to form a protrusion. This additional manufacturing process allows for reliable bonding between the package case and the cap, but prevents reductions in the cost of the semiconductor device. It should be noted that other prior art includes JP-A Nos. 2003-152131, 2002-208650, 2002-118193, and 6-188672 (1994).

SUMMARY OF THE INVENTION

The present invention has been devised to solve the above problems. It is, therefore, an object of the present invention to provide a semiconductor device in which a semiconductor element is hermetically sealed within an enclosure formed by a package case and a cap that are bonded together by a simple, low cost process. Another object of the present invention is to provide a method for manufacturing such a semiconductor device.

The features and advantages of the present invention may be summarized as follows.

According to one aspect of the present invention, a semiconductor device includes:

a package case in which a semiconductor element is mounted and having a bonding portion;

a cap having a bonding portion bonded to the bonding portion of the package case so as to hermetically seal the semiconductor element; and one or more bonding/sealing wires disposed between and in contact with the bonding portion of the package case and the bonding portion of the cap such that the one or more bonding/sealing wires form a closed loop and thereby hermetically seal the semiconductor element.

According to another aspect of the present invention, a method for manufacturing a semiconductor device, includes:

a bonding/sealing wire disposing step of disposing a bonding/sealing wire in a closed loop on either one of a bonding portion of a package case or a bonding portion of a cap, the package case having a semiconductor element mounted therein, the bonding portion of the package case and the bonding portion of the cap being adapted to be bonded together by the bonding/sealing wire; and a hermetically sealing step of bonding the bonding portion of the package case and the bonding portion of the cap together by the bonding/sealing wire to hermetically seal the semiconductor element;

wherein the bonding/sealing wire disposing step includes:

a wire end disposing step of disposing one end of the bonding/sealing wire on the either one of the bonding portion of the package case or the bonding portion of the cap;

a concave portion forming step of forming a concave portion at a predetermined location on the one end of the bonding/sealing wire; and a wire end crossing step of disposing the other end of the bonding/sealing wire over the concave portion of the one end of the bonding/sealing wire.

Other and further objects, features and advantages of the invention will appear more fully from the following description.

DETAILED DESCRIPTION OF THE PREFERRED EMBODIMENTS

First Embodiment

Figure 1:
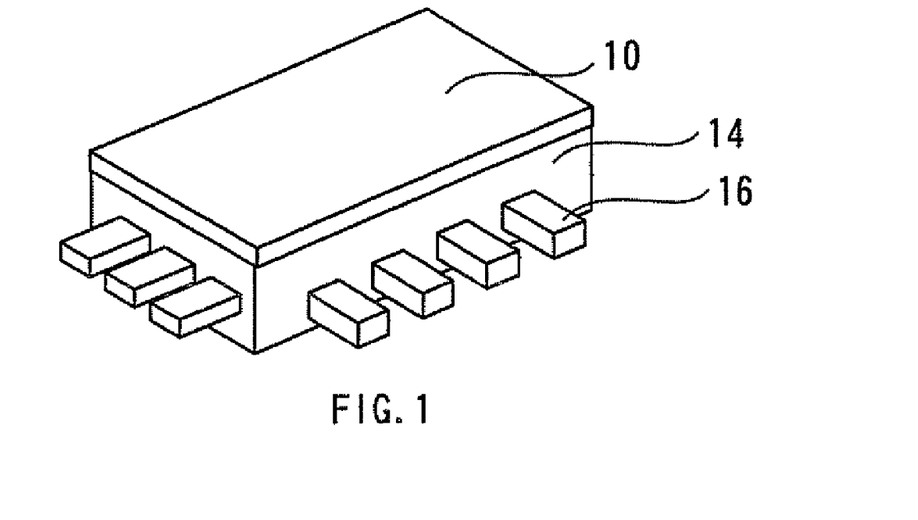
FIG. 1 is a perspective view illustrating the configuration of a semiconductor device according to a first embodiment of the present invention.

FIG. 1 is a perspective view illustrating the configuration of a semiconductor device according to a first embodiment of the present invention. This semiconductor device includes a package case 14 which is a box-like container having at least one open side. A cap 10 is disposed to cover this open side. The cap 10 is bonded to the package case 14 so as to hermetically seal the inside of the package case 14 or the package.

Figure 2:
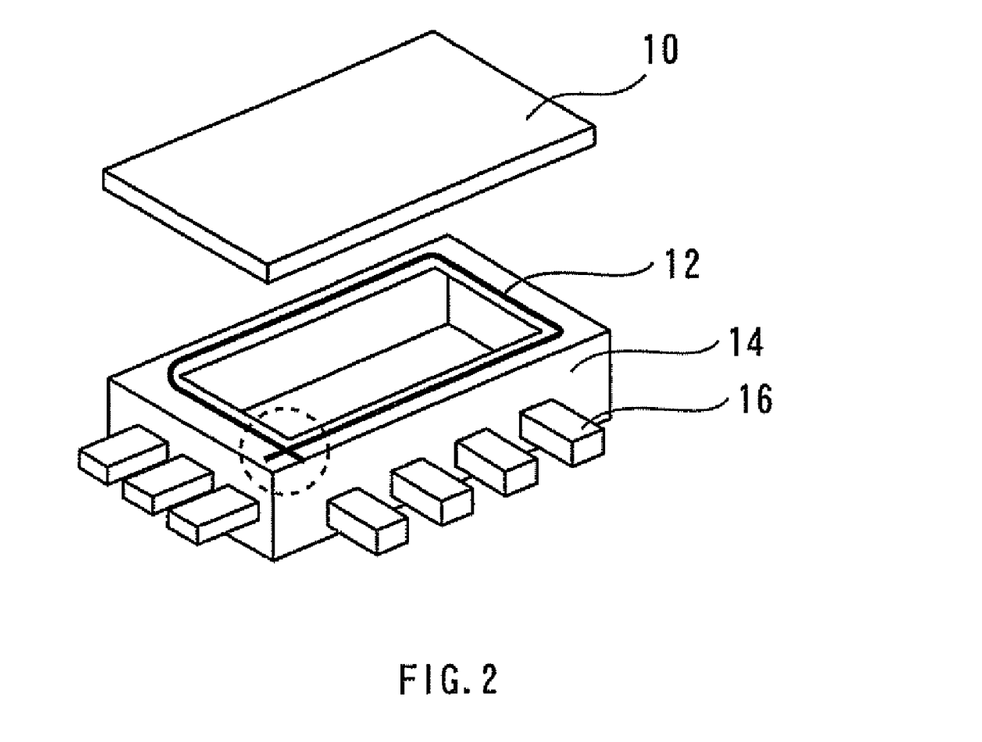
FIG. 2 is a perspective view illustrating in detail a method for bonding the cap to the package case in accordance with the present invention.

FIG. 2 is a perspective view illustrating in detail a method for bonding the cap 10 to the package case 14 in accordance with the present invention. Specifically, FIG. 2 shows the package case 14 and the cap 10 before they are bonded together. As shown, the package case 14 has one open side. Though not shown, a semiconductor element is mounted at a predetermined position on an inner wall of the package case 14 through this open side. It should be noted that the semiconductor element mounted in the package case 14 is of the type that need be protected from environmental effects such as moisture, contamination, heat, and electromagnetic field. Therefore, according to the present embodiment, the semiconductor element is hermetically sealed, as shown in FIG. 1. Examples of such semiconductor elements include high frequency devices and optical modules. The package case 14 has external electrodes 16 protruding outward from surfaces thereof. These external electrodes 16 are provided to carry signals input to and output from the semiconductor element mounted on the inner wall of the package case 14.

Further, the semiconductor device of the present embodiment includes a bonding/sealing wire 12. The bonding/sealing wire 12 is disposed on and along the rim of the open side of the package case 14 before the package case 14 and the cap 10 are bonded together. More specifically, the bonding/sealing wire 12 is bonded along the rim of the open side of the package case 14 by a bonding tool so as to form a complete loop. According to the present embodiment, the bonding/sealing wire 12 is a single wire having its ends crossed one over the other. As shown in FIG. 2, these crossed ends are located at a corner of the rim of the open side of the package case 14. Thus, the ends of the bonding/sealing wire 12 are crossed to form a closed loop. The bonding/sealing wire 12 thus disposed is sandwiched between the package case 14 and the cap 10 and used to bond them together. Specifically, the cap 10 is placed and positioned on the rim of the package case 14 with the bonding/sealing wire 12 therebetween and bonded to the package case 14 by pressing the cap 10 against the package 14 or by the application of heat or ultrasonic wave energy, etc. (This process achieves hermetic sealing of the package and is hereinafter referred to as a "hermetic sealing process.") The choice of bonding method is determined by the characteristics of the bonding/sealing wire 12. As a result of this bonding, the semiconductor element is hermetically sealed from the outside environment. It should be noted that in the completed semiconductor device, the bonding/sealing wire 12 is externally invisible, as shown in FIG. 1.

According to the present embodiment, the portion of the package case 14 bonded to the cap 10 (that is, the rim of the open side of the package case 14) has a rectangular shape, as shown in FIG. 2. Therefore, the bonding/sealing wire 12 is disposed to form a closed rectangular loop corresponding to the rectangular shape of the open side rim of the package case 14. The choice of material for the bonding/sealing wire 12 is determined by taking into account the productivity and cost of the semiconductor device. That is, for example, when the bonding is performed by the application of pressure, the bonding/sealing wire 12 need be made of a flexible material, since the gap between the package case and the cap after the bonding must be smaller than the original diameter of the bonding/sealing wire 12. When the bonding is by heat, the bonding/sealing wire 12 need be made of a low melting point material. Further, when the bonding is achieved by the application of ultrasonic vibration, the bonding/sealing wire 12 need be made of a suitable metal material for that purpose. Thus, there are various materials that may be used to form the bonding/sealing wire 12. Suitable materials include: Au; metals and alloys having a lower melting point than Au; AuSn solder; SnAgCu solder; and In with an Au coating on its surface.

Figure 3:
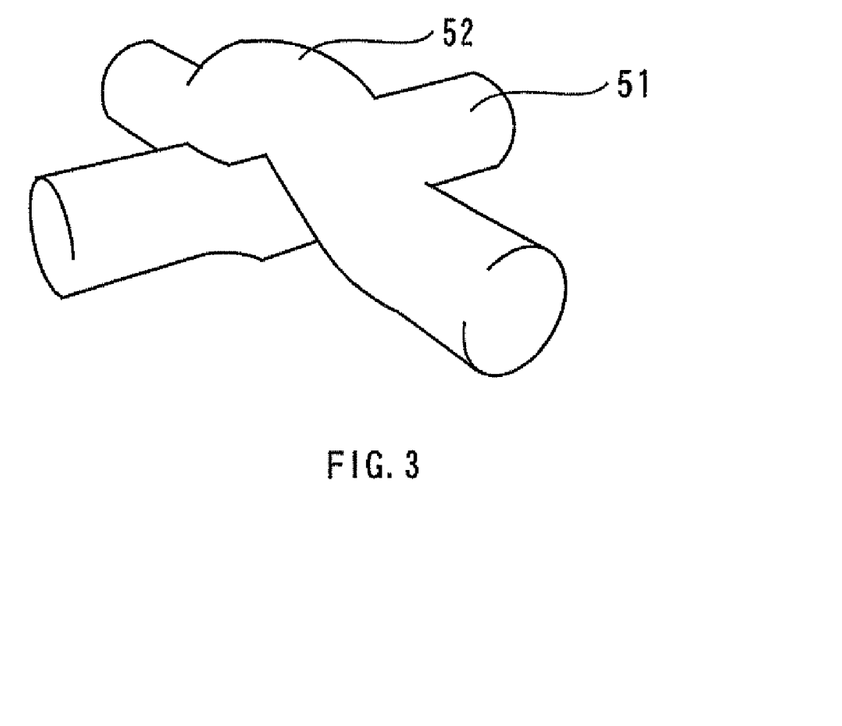
FIG. 3 is an enlarged view of the portion of the bonding/sealing wire shown encircled by a broken line in FIG. 2.
Figure 4:
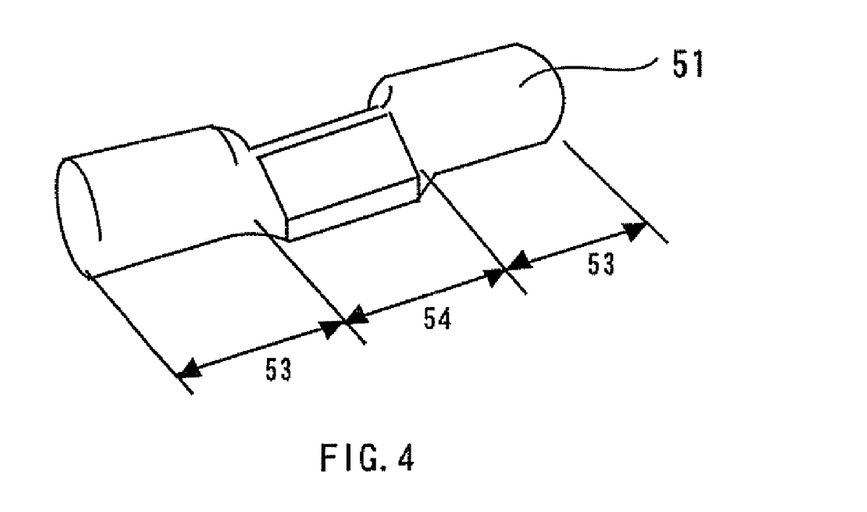
FIG. 4 is a perspective view of the first wire end before the second wire end is disposed to cross and overlie the first wire end.
Figure 5:
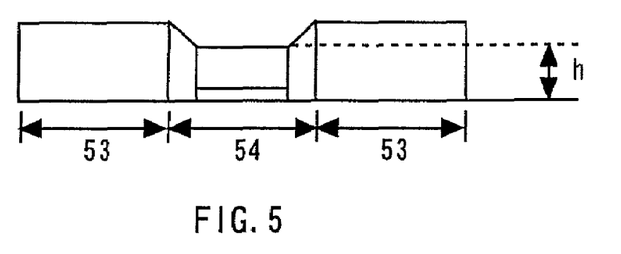
FIG. 5 is an elevational view of the first wire end.

There will now be described the configuration of the crossed ends of the bonding/sealing wire 12. FIG. 3 is an enlarged view of the portion of the bonding/sealing wire 12 shown encircled by a broken line in FIG. 2. As shown in FIG. 3, one end of the bonding/sealing wire 12 crosses and overlies the other end. The underlying end (disposed on the rim of the package case 14 before disposing the overlaying end) is hereinafter referred to as a "first wire end 51," and the overlaying end is hereinafter referred to as a "second wire end 52." FIG. 4 is a perspective view of the first wire end 51 before the second wire end 52 is disposed to cross and overlie the first wire end 51. The first wire end 51 includes a concave portion 54, as shown in FIG. 4. Note that the concave portion 54 is where the second wire end 52 crosses and overlies the first wire end 51. The portions of the first wire end 51 on both sides of the concave portion 54 are hereinafter referred to as "non-concave portions 53." The concave portion 54 is formed by concavely deforming a portion of the first wire end 51 after disposing it on the package case 14. Specifically, the concave portion 54 is formed by applying one or more of pressure, heat, ultrasonic vibration, etc., using a bonding tool. At that time, the concave portion 54 is bonded to the rim of the package case 14. The second wire end 52 is then disposed to cross and overlie the concave portion 54 of the first wire end 51, with the result that the second wire and 52 is in line contact with the concave portion 54, thus increasing the bonding area and hence the bonding strength. FIG. 5 is an elevational view of the first wire end 51. In FIG. 5, symbol h denotes the height of the concave portion 54 from the top surface of the package case 14. According to the present embodiment, the height h of the concave portion 54 is 10-90% of the height of the non-concave portions 53. The reason for this is as follows. If the height h of the concave portion 54 is less than 10t of the height of the non-concave portions 53, these portions 54, 53 may become severed from each other. On the other hand, if the height h of the concave portion 54 is more than 90% of the height of the non-concave portions 53, it results in a reduced bonding area and hence a reduced bonding strength (between the package case and the cap). This may result in detachment of the cap from the package case, which prevents hermetic sealing of the semiconductor element.

As described above, the bonding/sealing wire 12 has its ends crossed one over the other, as shown in FIG. 2. These ends have the configurations shown in FIGS. 3, 4, and 5. After disposing the bonding/sealing wire 12 as shown in FIG. 2, the cap 10 is placed on the rim of the package case 14 with the bonding/sealing wire 12 therebetween and bonded to the package case 14 by applying one or more of pressure, heat, and ultrasonic vibration to the bonding/sealing wire 12, with the result that the semiconductor element is hermetically sealed within the package.

Figure 6:
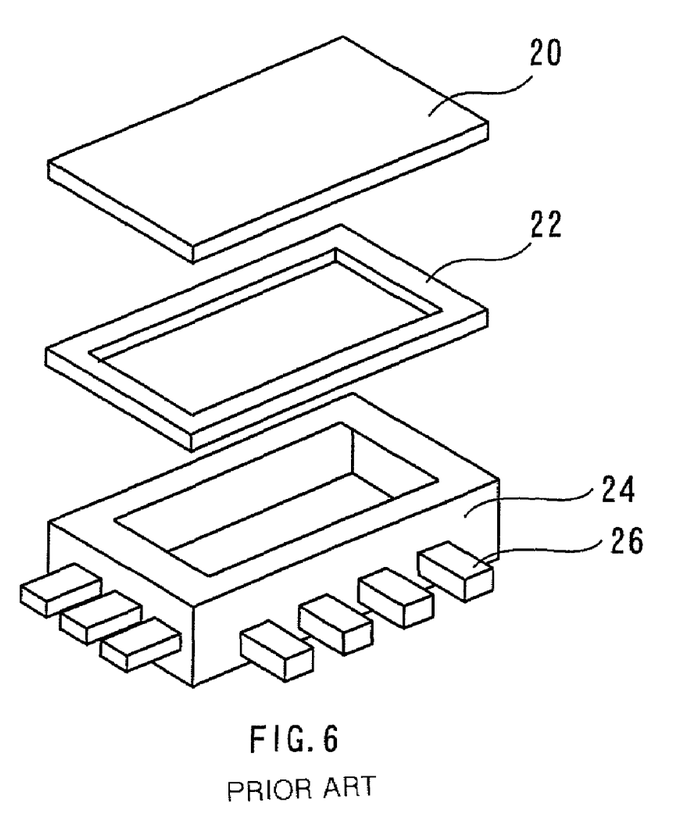
FIG. 6 is a diagram illustrating the configuration of a first comparative semiconductor device.

To better understand the semiconductor device and the manufacturing method of the present embodiment, it will be helpful to describe comparative conventional semiconductor devices. FIG. 6 is a diagram illustrating the configuration of a first comparative semiconductor device. The following description of the first comparative semiconductor device will be directed only to the differences from the semiconductor device of the present embodiment. Referring to FIG. 6, in the first comparative semiconductor device, a cap 20 is bonded to a package case 24 by a solder ring 22 disposed in a closed loop on and along the rim of the open side of the package case 24. The solder ring 22 is preformed to a shape corresponding to the shape of the rim of the open side of the package case 24 (to which the cap 20 is bonded). That is, the solder ring 22 is manufactured before bonding the cap 20 to the package case 24. This comparative semiconductor device is hermetically sealed by heating the solder ring 22 sandwiched between the package case 24 and the cap 20 and thereby bonding them together.

A second comparative semiconductor device having a different configuration than the first comparative semiconductor device will now be described. The following description of the second comparative semiconductor device will be directed only to the differences from the semiconductor device of the present embodiment to avoid undue repetition. This comparative semiconductor device is disclosed in JP-A-08-227946 noted above. In the second comparative semiconductor device, the cap has a protrusion, and the package case has a groove structure to be in contact with (or to receive) the protrusion of the cap. The package case and the cap are bonded together at low temperature by causing the protrusion of the cap to contact and engage the groove structure of the package case and then applying ultrasonic vibration to the cap while pressing the cap and the package case together and holding the package case against movement. The protrusion of the cap of the second comparative semiconductor device is formed by forming a film over the cap in the wafer manufacturing process by plating, etc. and then selectively removing portions of the film.

In both comparative semiconductor devices, the semiconductor element can be hermetically sealed within the package. However, the first comparative semiconductor device is disadvantageous in that the solder ring must be formed by an additional process separate from the process of bonding the cap to the package case, thus complicating the manufacturing process and hence preventing reductions in the cost of the semiconductor device. Further, the second comparative semiconductor device is disadvantageous in that it requires forming a groove structure on the package case and its wafer manufacturing process includes an additional process step for forming a protrusion on the cap, thus complicating the manufacturing process and hence preventing reductions in the cost of the semiconductor device. The protrusion of the cap of the second comparative semiconductor device may be formed by photolithography after forming a film over a predetermined entire surface. However, such a protrusion need have a sufficient adhesion to the cap and have a width of at least 0.1 mm due to the resolution limit of the photolithographic process (the critical dimension). That is, it is practically impossible to reduce the dimensions of the protrusion and thereby reduce the manufacturing cost.

Further, when the package area is large, both the package case and the cap are bound to have a certain amount of warpage. Assume that the mating bonding portions of the package case and the cap have warpage. In such a case, the first comparative semiconductor device must be designed such that the solder ring 22 has an increased thickness. As for the second comparative semiconductor device, the protrusion of the cap must be increased in length. However, such increases result in decreased production efficiency and increased process cost.

The present embodiment solves these problems. That is, in the semiconductor device of the present embodiment, the bonding/sealing wire 12 is installed at a predetermined location by a bonding tool, as described above. Therefore, the semiconductor device of the present embodiment can be manufactured by a simpler manufacturing process than those of the first and second comparative semiconductor devices. Specifically, it is not necessary to preform a solder ring (as in the first comparative semiconductor device) nor to form a protrusion on the cap in the wafer manufacturing process (as in the second comparative semiconductor device), resulting in reduced cost of the semiconductor device. Of course, the semiconductor device of the present embodiment may also suffer from the above problem of warpage of the bonding surfaces of the package case and the cap. However, that problem can be overcome by increasing the thickness of the bonding/sealing wire 12, which is a lower cost solution as compared to increasing the thickness of the solder ring 22 in the first comparative semiconductor device or increasing the length of the protrusion of the cap in the second comparative semiconductor device in a film forming process. Furthermore, these additional process steps for the first and second comparative semiconductor devices result in reduced productivity. (For example, in the case of the second comparative semiconductor device, the additional process step leads to an increase in the time required for plating.) On the other hand, the productivity of the semiconductor device of the present embodiment does not vary with the diameter of the bonding/sealing wire 12, making it possible to overcome the problem of warpage of the bonding surfaces of the package case and the cap at low cost.

Further, in the case of the semiconductor device of the present embodiment, when the cap 10 is bonded to the package case 14, the bonding/sealing wire 12 need be deformed by only a small amount, which allows a reduction in the bonding pressure while achieving hermetic sealing of the semiconductor element. That is, it is possible to hermetically seal the semiconductor element with little pressure damage to the package case 14 and the cap 10. Further, in the semiconductor device of the present embodiment, the concave portion 54 of the first wire end 51 is formed to a controlled thickness h, and the second wire end 52 is disposed to cross and overlie the concave portion 54, as described above. This increases the bonding strength between the first and second wire ends (and between the cap and the rim of the package case) and ensures reliable establishment of hermetic sealing.

Figure 7:
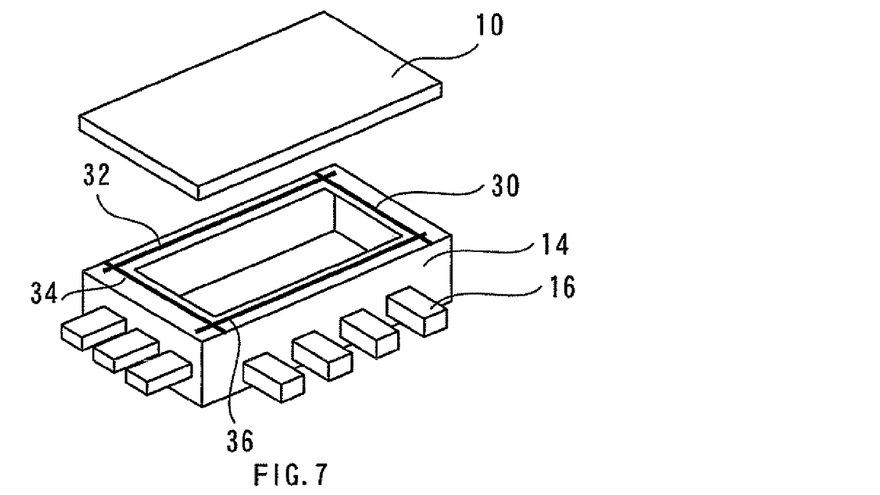
FIG. 7 is a diagram illustrating the semiconductor device having a plurality of bonding/sealing wires.

Although in the present embodiment the semiconductor device employs only a single bonding/sealing wire (namely, the bonding/sealing wire 12), in other embodiments it may employ a plurality of bonding/sealing wires, with the same effect. That is, these bonding/sealing wires may be disposed to form a closed loop, as shown in FIG. 7, which allows the cap to be bonded to the package case by a simple process while establishing hermetic sealing of the semiconductor element.

In the present embodiment, the cap 10 and the package case 14 are bonded together (so as to hermetically seal the semiconductor element) after mounting the bonding/sealing wire 12 on the package case 14. In other embodiments, however, the cap and the package case may be bonded together after mounting the bonding/sealing wire 12 on the cap, with the same effect (since the number of process steps is the same in both cases).

Although in the present embodiment the cap is bonded to the package case by the bonding/sealing wire 12, in other embodiments a ribbon-shaped wire may be used to bond the cap to the package case. That is, the effect of the present invention can be achieved if this ribbon-shaped wire allows for as simple a bonding process as the bonding/sealing wire 12 and hence provides a reduction in the number of process steps.

Second Embodiment

Figure 8A:
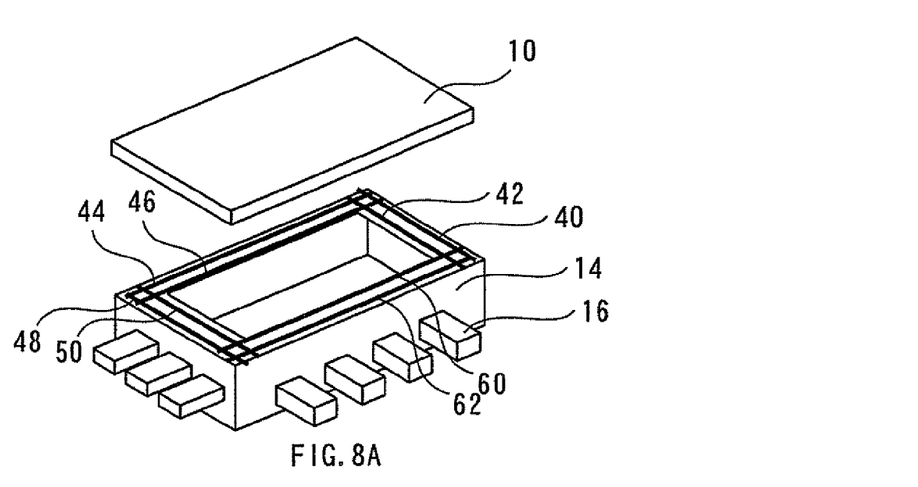
FIG. 8 is a perspective view illustrating the configuration of the semiconductor device of the second embodiment.

A second embodiment of the present invention provides a semiconductor device in which a semiconductor element is reliably hermetically sealed within a package, and provides a method for manufacturing such a semiconductor device. The following description of the present embodiment will be directed only to the differences from the first embodiment. FIG. 8A is a perspective view illustrating the configuration of the semiconductor device of the present embodiment. This semiconductor device includes eight bonding/sealing wires, namely, bonding/sealing wires 40, 42, 44, 46, 48, 50, 60, and 62. Each pair of these eight bonding/sealing wires are disposed on and along a respective side of the rim of the open side of a package case 14 (i.e., the bonding/sealing wires of each pair extend parallel to each other). The ends of the eight bonding/sealing wires cross one another, as shown in FIG. 8A, so that the bonding/sealing wires together form two concentric closed loops.

Figure 8B:
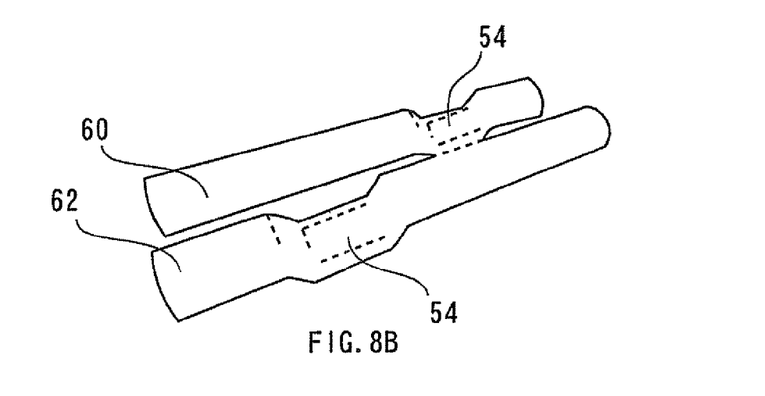

FIG. 8B is an enlarged view of the portions of the two bonding/sealing wires 60 and 62 that extend parallel to each other along a side (not at a corner) of the rim of the open side of the package case 14. Each bonding/sealing wire 60, 62 includes a concave portion 54 for fixing the wire to the rim of the package case 14. (It should be noted that the crossed ends of the bonding/sealing wires are also fixed to the rim of the package case.) These concave portions 54 of the bonding/sealing wires 60 and 62 are spaced a predetermined distance from each other along the rim. That is, the concave portions 54 are not juxtaposed to each other, as shown in FIG. 8B. (This arrangement of concave portions is hereinafter referred to as "unjuxtaposed arrangement of concave portions.") These concave portions are formed by applying one or more of pressure, heat, ultrasonic vibration, etc., using a bonding tool. Although the above description has been directed to the bonding/sealing wires 60 and 62, it is to be understood that each of the other pairs of bonding/sealing wires also includes such concave portions that are not juxtaposed to each other. It should be noted that the crossed ends of the eight bonding/sealing wires are subjected to the same deformation process as described in connection with the first embodiment.

After forming the bonding/sealing wires in the above-described manner, the cap 10 is bonded to the package case 14 to hermetically seal the semiconductor device. According to the present embodiment, this hermetic sealing of the semiconductor element can be reliably achieved since the bonding/sealing wires disposed on and along the rim of the package case together form two concentric closed loops. Further, the above "unjuxtaposed arrangement" of the concave portions of each pair of bonding/sealing wires ensures that the non-concave portions of the bonding/sealing wires are arranged immediately adjacent one another along the entire length of the rim of the package case 14. This enables the cap 10 and the package case 14 to be reliably and firmly bonded together by the non-concave portions of the bonding/sealing wires (arranged along the entire length of the rim of the package case), resulting in more reliable hermetic sealing.

Although in the present embodiment the bonding/sealing wires are disposed to together form two concentric closed loops, in other embodiments they may together form three or more concentric closed loops, with the same effect.

Although in the present embodiment the concave portions of each pair of bonding/sealing wires (disposed on a respective side of the rim of the package case) are in the above "unjuxtaposed arrangement," the present invention is not limited to this particular arrangement. The effect of the present invention (that is, reliable hermetic sealing of the semiconductor device) can be achieved as long as the concave portions of each pair of bonding/sealing wires are disposed on a respective side of the rim of the package case (that is, as long as these concave portions are disposed at a place other than the corner of the rim at which ends of the bonding/sealing wires cross one another).

Third Embodiment

Figure 9:
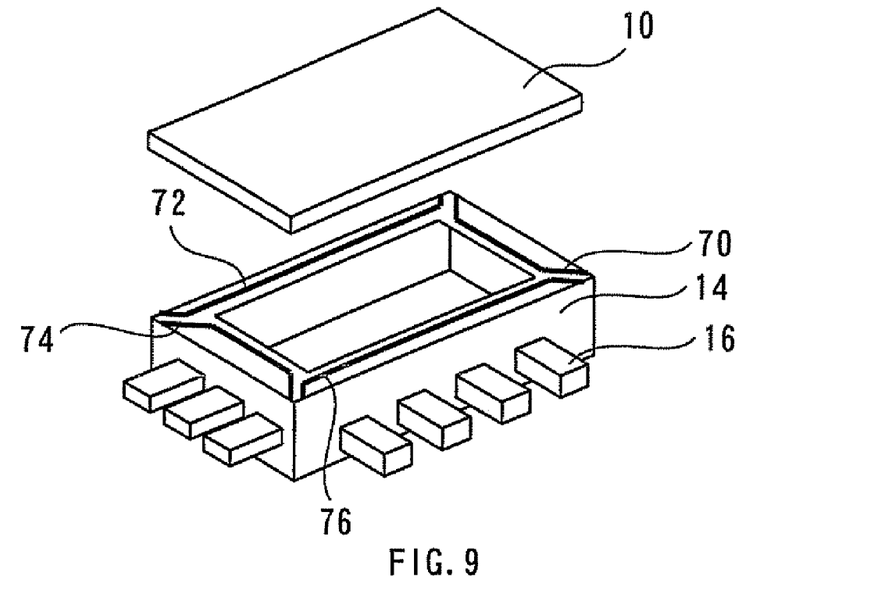
FIG. 9 is a diagram illustrating the configuration of the semiconductor device of the third embodiment.

A third embodiment of the present invention provides a semiconductor device in which the package case and the cap are firmly bonded together, and provides a method for manufacturing such a semiconductor device. The following description of the present embodiment will be directed only to the differences from the first embodiment. FIG. 9 is a diagram illustrating the configuration of the semiconductor device of the present embodiment. Specifically, FIG. 9 shows its package case 14 and cap 10 before they are bonded together. The semiconductor device of the present embodiment includes bonding/sealing wires 70, 72, 74, and 76. Each bonding/sealing wire is disposed on a respective side of the rim of the open side of the package case 14, as shown in FIG. 9. (The cap 10 is bonded to the rim of the package case 14 by the bonding/sealing wires.) It should be noted that before the cap 10 is bonded to the package case 14, the adjacent ends of each adjacent pair of these bonding/sealing wires do not cross each other but extend parallel to each other at a respective corner of the rim of the open side of the package case. These adjacent ends of each adjacent pair of bonding/sealing wires are spaced from each other in such a way that they come in contact with each other when the cap 10 is bonded to the package case 14.

According to the present embodiment, after placing the cap 10 over the bonding/sealing wires 70, 72, 74, and 76 (disposed on the rim of the package case 14 in the above-described manner), the cap 10 is bonded to the package case 14 by applying one or more of pressure, heat, ultrasonic vibration, etc.

Thus, the semiconductor device of the present embodiment differs from that of the first embodiment in that before the cap is bonded to the package case, the adjacent ends of each adjacent pair of bonding/sealing wires do not cross each other but extend parallel to each other. This means that the entire portions of the bonding/sealing wires are on the top surface of the rim of the package case (i.e., on the same plane) since there is no overlap between the bonding/sealing wires. This allows uniform application of pressure, ultrasonic vibration, etc. when bonding the cap and the package case together while pressing the cap against the bonding/sealing wires. (In the case of the semiconductor device of the first embodiment, for example, pressure or ultrasonic vibration may concentrate on the overlapped or crossed portions of the bonding/sealing wire.) Thus, the present embodiment ensures uniform bonding between the package case and the cap, resulting in reliable hermetic sealing of the semiconductor device.

In the present embodiment, the bonding/sealing wires are not in contact with each other before the cap 10 is bonded to the package case 14. In other embodiments, however, these bonding/sealing wires may be disposed in contact with each other without overlap. This still ensures uniform bonding between the package case and the cap and hence achieves the effect of the present invention.

Figure 10:
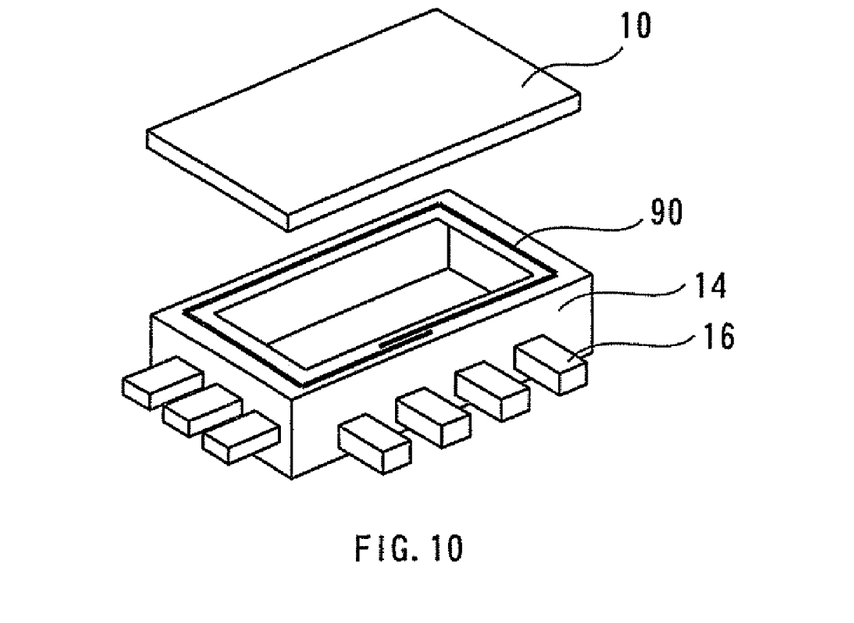
FIG. 10 is a diagram illustrating the semiconductor device having a bonding/sealing wire which ends are not disposed at a corner of the rim of the open side of the package case.

In the present embodiment, the semiconductor device includes a plurality of bonding/sealing wires, and the adjacent ends of each adjacent pair of these bonding/sealing wires extend parallel to each other at a respective corner of the rim of the open side of the package case. In other embodiments, however, the semiconductor device may include only a single bonding/sealing wire (as indicated by reference numeral 90 in FIG. 10), and both ends of this bonding/sealing wire may extend side by side in opposite directions along a side of the rim of the package case as shown in FIG. 10 (i.e., these ends are not disposed at a corner of the rim of the open side of the package case). This arrangement also ensures uniform bonding between the package case and the cap. That is, the present invention is not limited to any particular number of bonding/sealing wires, and the ends of these bonding/sealing wires need not necessarily be installed at a corner of the rim of the package case. Thus, the present invention enables a semiconductor device to be hermetically sealed by a simple, low cost process.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-158234, filed on Jun. 15, 2007 including specification, claims, drawings and summary, on which the Convention priority of the present application is based, are incorporated herein by reference in its entirety.

What is claimed is:

1. A semiconductor device comprising:
   a semiconductor element;
   a package case including an interior volume in which said semiconductor element is mounted, said package case having an open side including a peripheral rim as a bonding surface;
   a cap having a bonding surface, said bonding surface of said cap being bonded to said bonding surface of said package case, hermetically sealing said semiconductor element in the interior volume of said package case; and
   a bonding/sealing wire having a length and longitudinally disposed between and in contact with said bonding surface of said package case and said bonding surface of said cap, said bonding/sealing wire being arranged in a closed loop and thereby hermetically sealing said semiconductor element in the interior volume of said package case, wherein said bonding/sealing wire includes first and second ends and the first end of said bonding/sealing wire crosses and overlies the second end of said bonding/sealing wire.

2. The semiconductor device as claimed in claim 1, wherein
   said bonding surface of said package case has a polygonal shape, and
   said first and second ends of said bonding/sealing wire cross at a corner of said bonding surface of said package case having the polygonal shape.

3. A semiconductor device comprising:
   a semiconductor element;
   a package case including an interior volume in which said semiconductor element is mounted, said package case having an open side including a peripheral rim as a bonding surface;
   a cap having a bonding surface, said bonding surface of said cap being bonded to said bonding surface of said package case, hermetically sealing said semiconductor element in the interior volume of said package case; and
   a bonding/sealing wire having a length and longitudinally disposed between and in contact with said bonding surface of said package case and said bonding surface of said cap, said bonding/sealing wire being arranged in a closed loop and thereby hermetically sealing said semiconductor element in the interior volume of said package case, wherein said bonding/sealing wire has first and second ends arranged side-by-side extending parallel to each other, and in contact with each other.

4. The semiconductor device as claimed in claim 1, wherein said bonding/sealing wire has a squashed shape where said first and second ends cross.

* * * * *